US010115617B2

(12) United States Patent
Bluck et al.

(10) Patent No.: US 10,115,617 B2
(45) Date of Patent: Oct. 30, 2018

(54) SYSTEM ARCHITECTURE FOR VACUUM PROCESSING

(71) Applicant: Intevac, Inc., Santa Clara, CA (US)

(72) Inventors: Terry Bluck, Santa Clara, CA (US);
Vinay Shah, San Mateo, CA (US);
Alexandru Riposan, Palo Alto, CA (US)

(73) Assignee: INTEVAC, INC., Santa Clara, CA (US)

( * ) Notice: Subject to any disclaimer, the term of this patent is extended or adjusted under 35 U.S.C. 154(b) by 4 days.

(21) Appl. No.: 15/284,450

(22) Filed: Oct. 3, 2016

(65) Prior Publication Data
US 2017/0025300 A1    Jan. 26, 2017

Related U.S. Application Data

(62) Division of application No. 13/871,871, filed on Apr. 26, 2013, now Pat. No. 9,502,276.

(60) Provisional application No. 61/639,052, filed on Apr. 26, 2012.

(51) Int. Cl.
*H01L 21/677* (2006.01)
*H01L 21/67* (2006.01)
*H01L 21/687* (2006.01)

(52) U.S. Cl.
CPC .. *H01L 21/67709* (2013.01); *H01L 21/67173* (2013.01); *H01L 21/67736* (2013.01); *H01L 21/67739* (2013.01); *H01L 21/67754* (2013.01); *H01L 21/67769* (2013.01); *H01L 21/67775* (2013.01); *H01L 21/67778* (2013.01); *H01L 21/67781* (2013.01); *H01L 21/68742* (2013.01); *H01L 21/68785* (2013.01)

(58) Field of Classification Search
CPC .................. H01L 21/67359; H01L 21/682
See application file for complete search history.

(56) References Cited

U.S. PATENT DOCUMENTS

2010/0098517 A1* 4/2010 Hishiya ............ H01L 21/67772
                                                414/160
2011/0269378 A1* 11/2011 Boo .......................... B24B 37/30
                                                451/28

* cited by examiner

*Primary Examiner* — Saul Rodriguez
*Assistant Examiner* — Willie Berry, Jr.
(74) *Attorney, Agent, or Firm* — Womble Bond Dickinson (US) LLP; Joseph Bach, Esq.

(57) ABSTRACT

A system for processing substrates in plasma chambers, such that all substrates transport and loading/unloading operations are performed in atmospheric environment, but processing is performed in vacuum environment. The substrates are transported throughout the system on carriers. The system's chambers are arranged linearly, such that carriers move from one chamber directly to the next. A conveyor, placed above or below the system's chambers, returns the carriers to the system's entry area after processing is completed. Loading and unloading of substrates may be performed at one side of the system, or loading can be done at the entry side and unloading at the exit side.

15 Claims, 13 Drawing Sheets

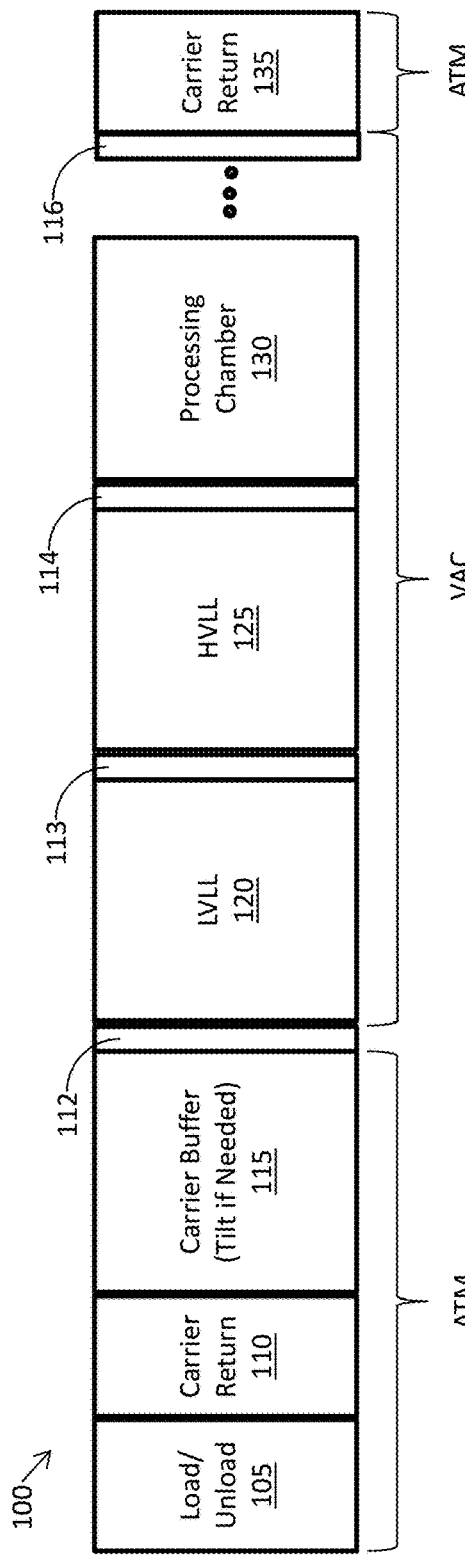
*Figure 1*
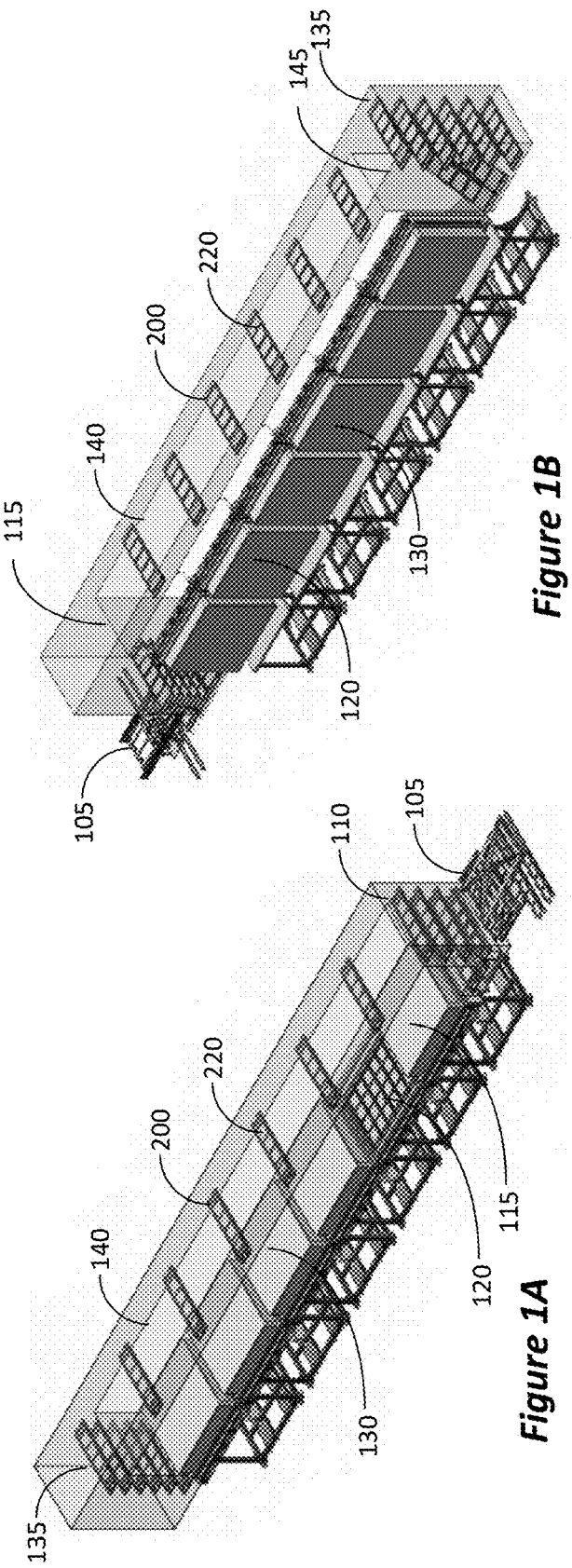
*Figure 1A*
*Figure 1B*

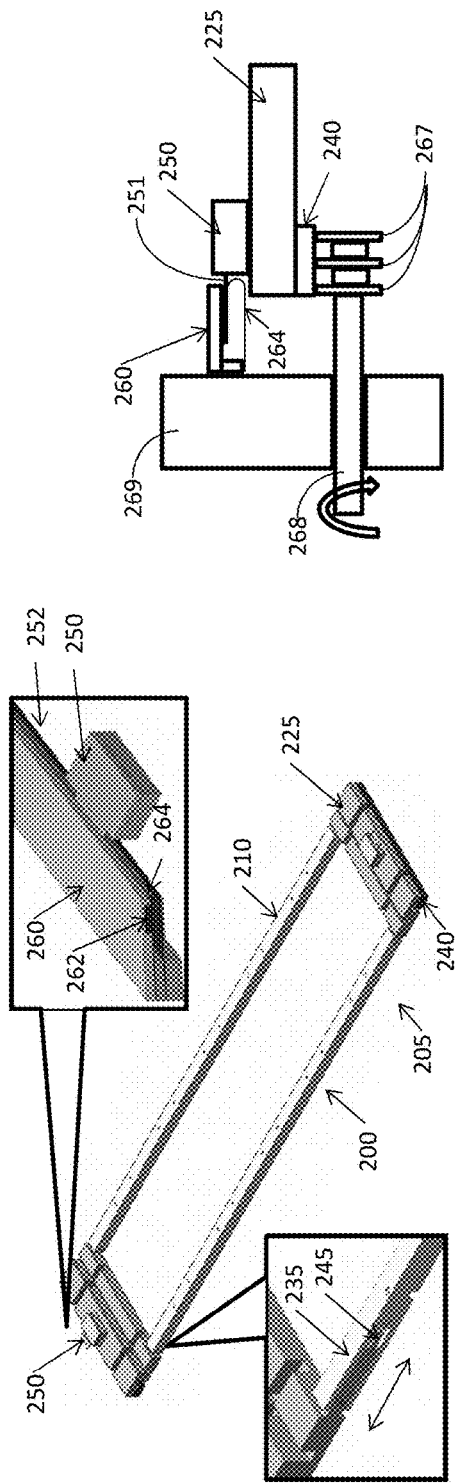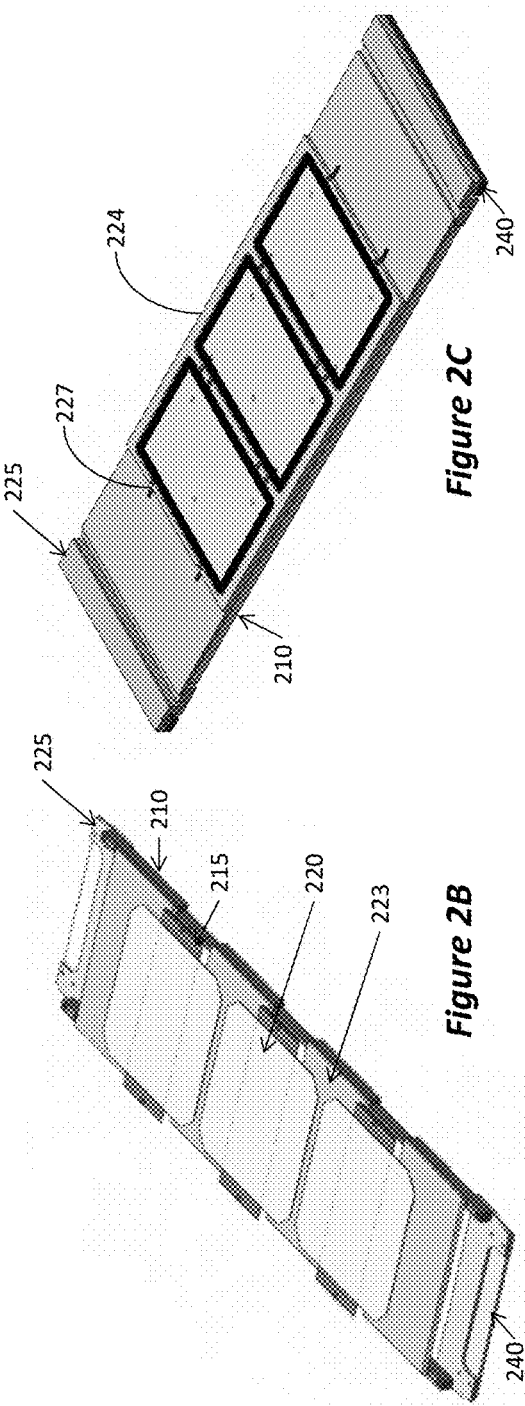

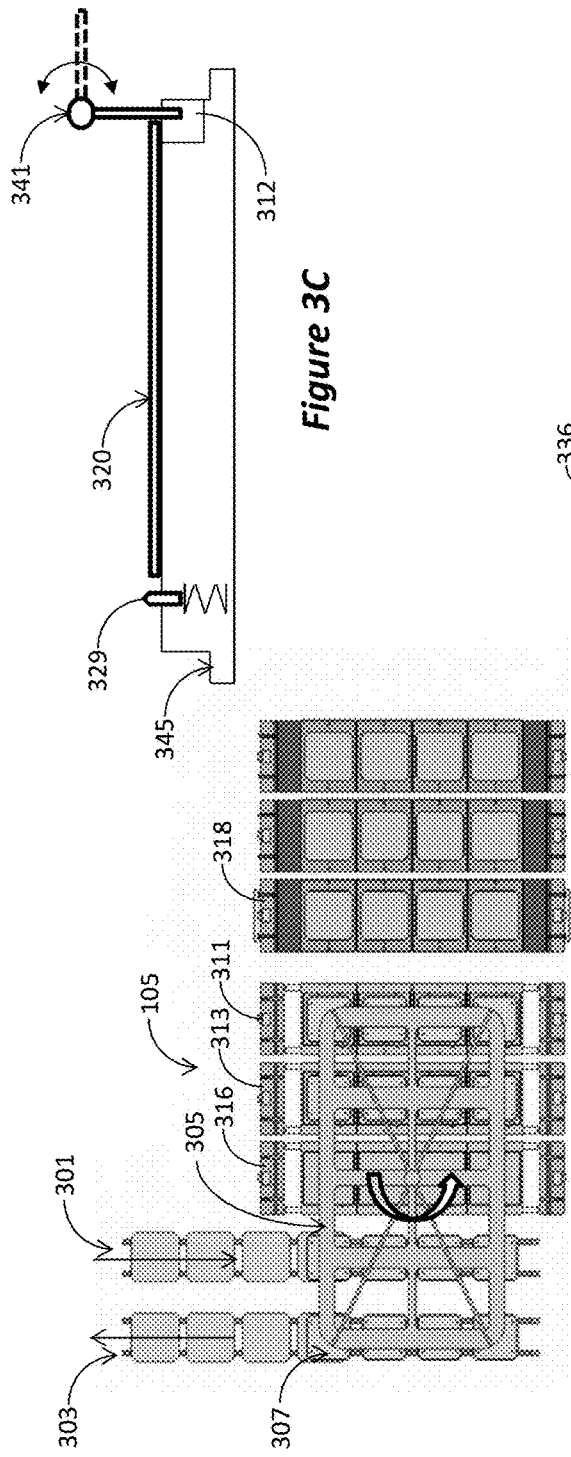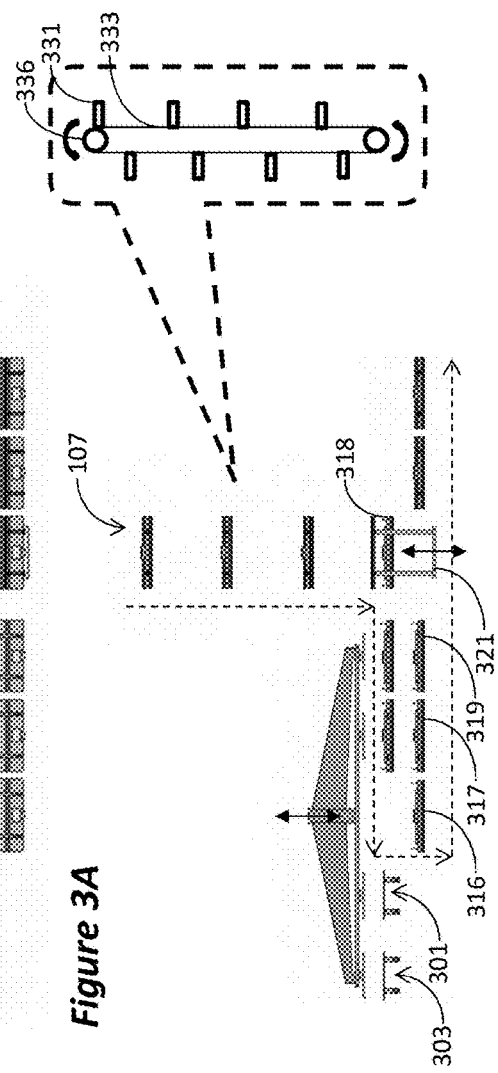
*Figure 3C*
*Figure 3A*
*Figure 3B*

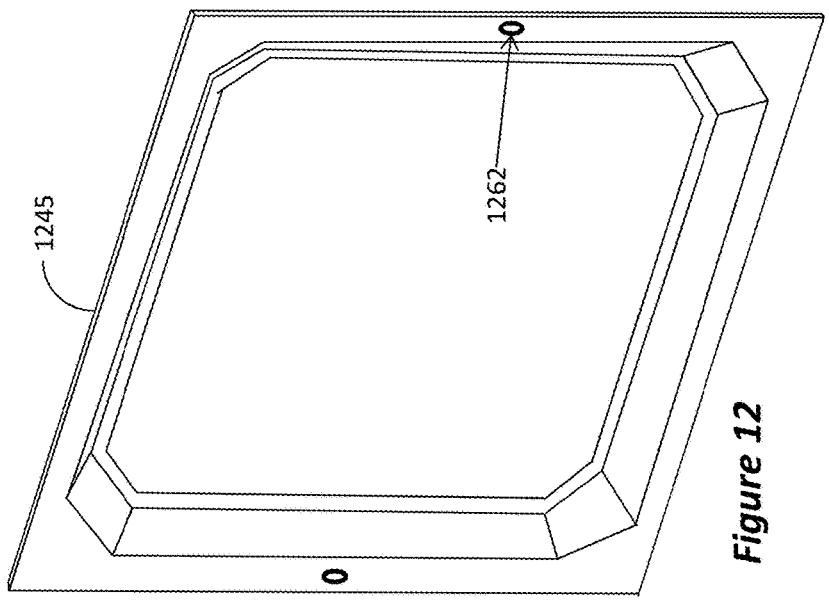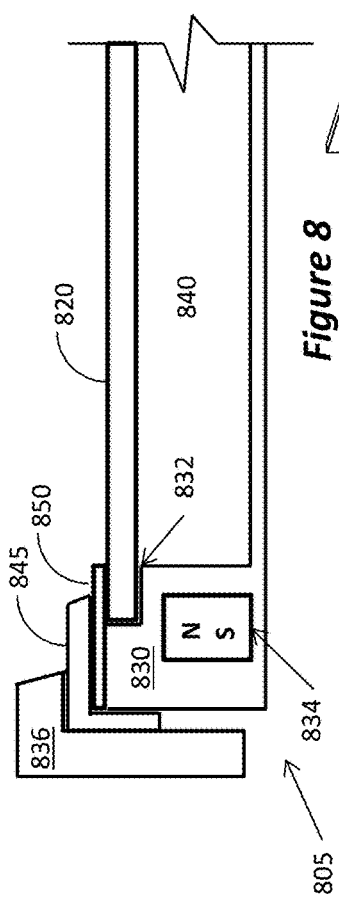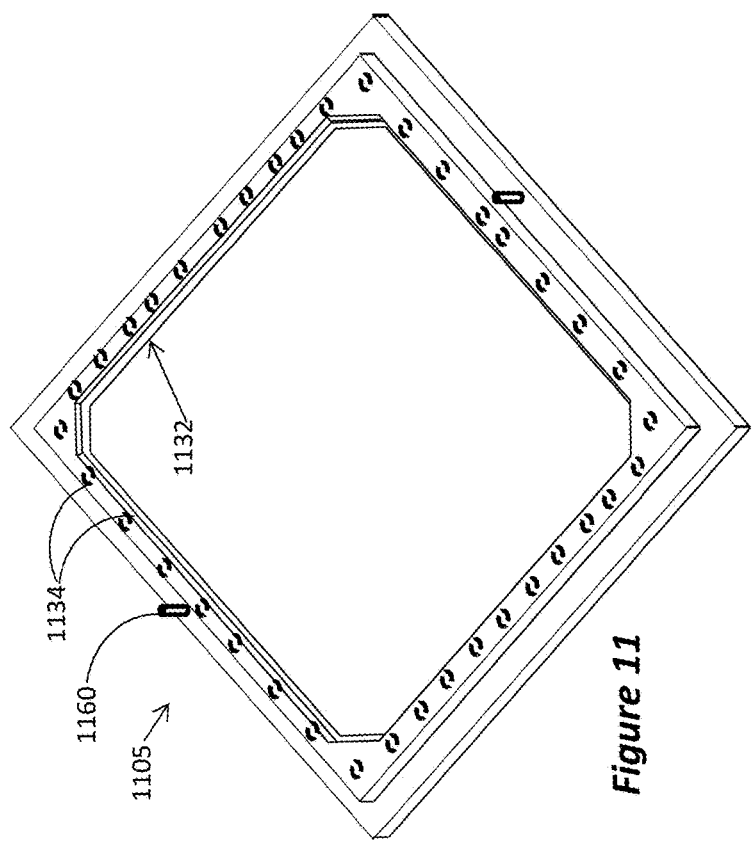

SYSTEM ARCHITECTURE FOR VACUUM PROCESSING

RELATED APPLICATIONS

This application is a divisional of U.S. patent application Ser. No. 13/871,871, filed on Apr. 26, 2016, which claims priority benefit from U.S. Provisional Application No. 61/639,052, filed on Apr. 26, 2012, the entire disclosures of which are incorporated herein by reference.

BACKGROUND

1. Field

This application relates to systems for vacuum processing, such as systems used in the fabrication of solar cells, flat panel displays, touch screens, etc.

2. Related Art

Various systems are known in the art for fabricating semiconductor IC's, solar cells, touch screens, etc. The processes of these systems are conducted in vacuum and include, e.g., physical vapor deposition (PVD), chemical vapor deposition (CVD), ion implant, etch, etc. There are two basic approaches for such systems: single-substrate processing or batch processing. In single wafer processing, only a single substrate is present inside the chamber during processing. In batch processing several substrates are present inside the chamber during processing. Single substrate processing enables high level of control of the process inside the chamber and the resulting film or structure fabricated on the substrate, but results in a relatively low throughput. Conversely, batch processing results in less control over the processing conditions and the resulting film or structure, but provides a much higher throughput.

Batch processing, such as that employed in systems for fabricating solar cells, touch panels, etc., is generally performed by transporting and fabricating the substrates in a two-dimensional array of n×m substrates. For example, a PECVD system for solar fabrication developed by Roth & Rau utilizes trays of 5×5 wafers for a reported 1200 wafers/hour throughput in 2005. However, other systems utilize trays having two dimensional arrays of 6×6, 7×7, 8×8, and even higher number of wafers. While throughput is increased utilizing trays of two-dimensional wafer arrays, the handling and the loading and unloading operations of such large trays becomes complex.

In some processes, it is required to apply bias, e.g., RF or DC potential, to the substrate being processed. However, since batch system utilize a moving tray with the substrates, it is difficult to apply the bias.

Also, while some processes can be performed with the substrate held horizontally, some processes can benefit from a vertically held substrate. However, loading and unloading of substrate vertically is complex compared to horizontal loading and unloading.

Some processes may require the use of masks to block parts of the substrate from the particular fabrication process. For example, masks may be used for formation of contacts or for edge exclusion to prevent shunting of the cell. That is, for cells having contacts on the front and back sides, materials used for making the contacts may be deposited on the edges of the wafer and shunt the front and back contacts. Therefore, it is advisable to use mask to exclude the edges of the cell during fabrication of at least the front or back contacts.

As another illustration, for the fabrication of silicon solar cells, it is desirable to deposit blanket metals on the back surface to act as light reflectors and electrical conductors. The metal is typically aluminum, but the blanket metals could be any metal used for multiple reasons, such as cost, conductivity, solderability, etc. The deposited film thickness may be very thin, e.g., about 10 nm up to very thick, e.g., 2-3 um. However, it is necessary to prevent the blanket metal from wrapping around the edge of the silicon wafer, as this will create a resistive connection between the front and back surfaces of the solar cell, i.e., shunting. To prevent this connection, an exclusion zone on the backside edge of the wafer can be created. The typical dimension of the exclusion zone is less than 2 mm wide, but it is preferable to make the exclusion as thin as possible.

One way to create this exclusion zone is through the use of a mask; however, using masks has many challenges. Due to the highly competitive nature of the solar industry, the mask must be very cheap to manufacture. Also, due to the high throughputs of solar fabrication equipment (typically 1500-2500 cells per hour), the mask must be quick and easy to use in high volume manufacturing. Also, since the mask is used to prevent film deposition on certain parts of the wafer, it must be able to absorb and accommodate deposition build up. Furthermore, since film deposition is done at elevated temperatures, the mask must be able to function properly at elevated temperature, e.g., up to 350° C., while still accurately maintaining the exclusion zone width, while accommodating substrate warpage due to thermal stresses.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Embodiments of the invention provide a system architecture that is modular, in that it enables using different processes and process steps, and versatile, in that it is suitable for fabrication of various devices, including, e.g., solar cells, flat panel displays, touch screens, etc. Moreover, the system can handle different types and sizes of substrates without reconfiguration, but by simply changing the susceptors used.

The system architecture enables substrate handling, such as loading and unloading in atmospheric environment, separate from the vacuum processing. Additionally, various embodiments enable manual loading and unloading with automation in idle or not present, i.e., the system can be implemented without loading/unloading automation. Inside the vacuum environment the system enables static or pass-by processing of the substrates. In certain embodiments, vacuum isolation is provided between each processing chamber, using actuated valves. Various embodiments provide for electrostatic chucking of the substrates to enable efficient cooling and to prevent accidental movement of the substrates. In other embodiments, mechanical chucking is enabled using, e.g., spring-loaded clips with relief mechanism for loading/unloading of the substrates. Various embodiments also enable biasing of the substrates using, e.g., RF or DC bias power, or floating the substrate.

Various embodiments enable simplified handling of substrates by having the handling performed on line-array carriers, while processing is performed on a two-dimensional array of n×m substrates, by processing several line-array carriers simultaneously. Other embodiments provide for transport mechanism wherein the substrates are processed in a vertical orientation, but loading and unloading is performed while the substrates are handled horizontally.

Embodiments of the invention also enables substrate processing using masks, which can be implemented by using a dual-mask arrangement. The two part masking system is configured for masking substrates, and includes an inner mask consisting of a flat metal sheet having apertures exposing the parts of the wafer that are to be processed; and, an outer mask configured for placing over and masking the inner mask, the outer mask having an opening cut of size and shape similar to the size and shape of the substrate, the outer mask having thickness larger than thickness of the inner mask. A mask frame may be configured to support the inner and outer masks, such that the outer mask is sandwiched between the mask frame and the inner mask. In one example, where the dual-mask arrangement is used for edge isolation, the opening cut in the inner mask is of size slightly smaller than the solar wafer, so that when the inner mask is placed on the wafer it covers peripheral edge of the wafer, and the opening cut in the outer mask is slightly larger than the opening cut in of the inner mask. A top frame carrier may be used to hold the inner and outer mask and affix the inner and outer masks to the wafer susceptor.

A loading and unloading mechanism is provided, which handles four rows of substrates simultaneously. The loading/unloading mechanism is configured for vertical motion, having a lowered position and an elevated position. In its lowered position, the mechanism is configured to simultaneously: remove a row of processed substrates from one carrier, deposit a row of fresh substrates on an empty carrier, deposit a row of processed substrates on a substrate removal mechanism, and collect a row of fresh substrates from a substrates delivery mechanism. The substrate removal mechanism and the substrate delivery mechanism may be conveyor belts moving in the same or opposite directions. In its elevated position, the mechanism is configured to rotate 180 degrees.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 illustrates an embodiment of a multi-substrate processing system, wherein transport carriers support a line-array of substrates, but processing is performed on a two-dimensional array of substrates.

FIG. 1A illustrates an example of a system wherein the carriers remain in a horizontal orientation during transport and processing, while FIG. 1B illustrates an example wherein the carriers are horizontal during transport and loading/unloading, but are vertical during processing.

FIG. 2 illustrates a multi-wafer carrier according to one embodiment, while FIG. 2A illustrates a partial cross-section.

FIG. 2B illustrates an example of carrier for processing silicon wafers, while FIG. 2C illustrates an example of a carrier for processing glass substrates.

FIG. 3A is a top view, while FIG. 3B is a side view of a load/unload mechanism according to one embodiment. FIG. 3C illustrates an embodiment for substrate alignment mechanism.

FIG. 8 is a cross section of an enlarged part of the frame, outer and inner masks, according to one embodiment.

FIG. 11 illustrate an embodiment of the single wafer carrier.

FIG. 12 illustrate an embodiment of the outer mask, viewing from the underside.

DETAILED DESCRIPTION

Figure 4:
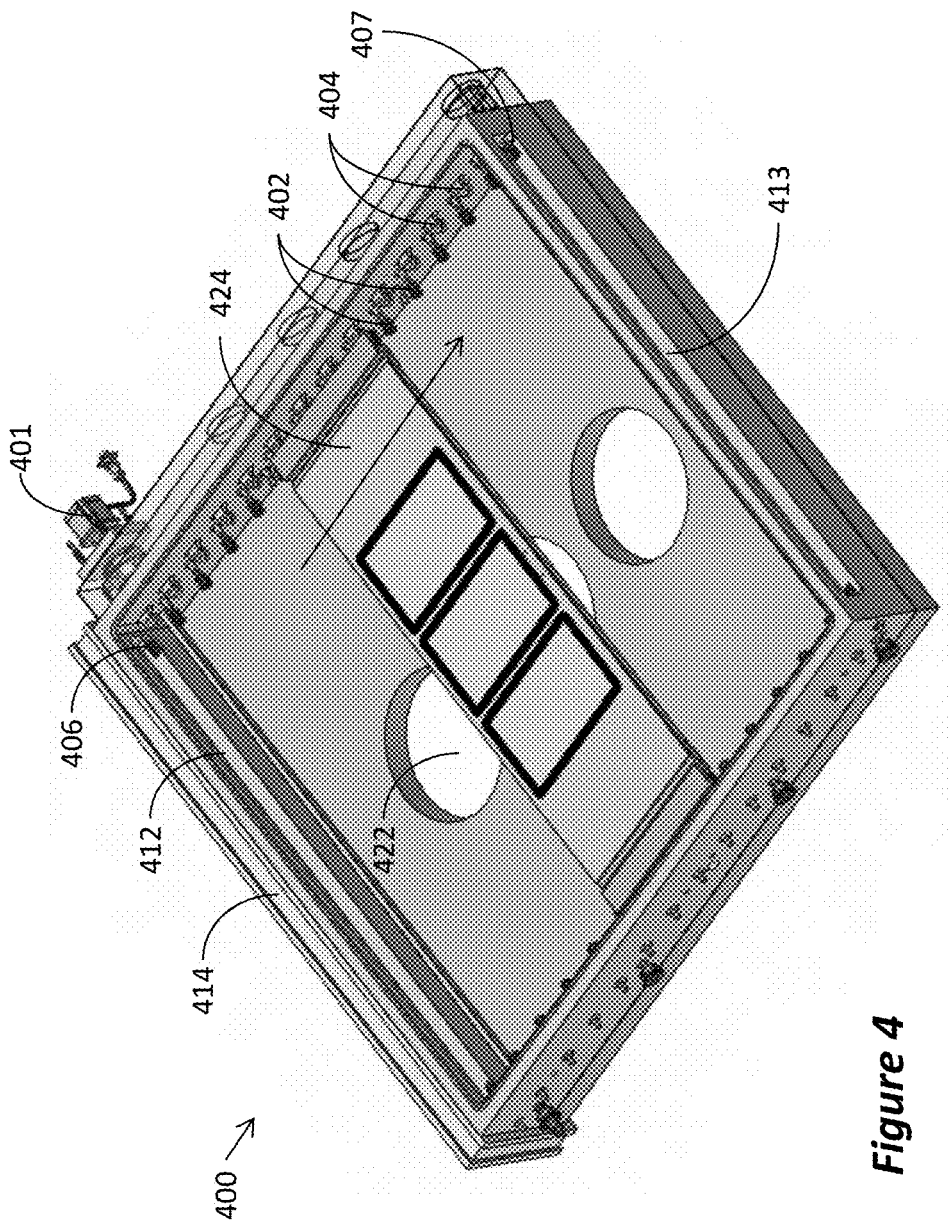
FIG. 4 illustrates an embodiment of a vacuum processing chamber 400 that may be used with the disclosed system.

The following detailed description provides examples that highlight certain features and aspects of the innovative processing system claimed herein. Various disclosed embodiments provide for a system wherein multiple substrates, e.g., semiconductor or glass substrates, are processed simultaneously inside a vacuum processing chamber, such as, e.g., a plasma processing chamber. While glass substrates, such as those used for touchscreens are not generally considered wafers, it should be appreciated that references made to wafers in this disclosure are made for convenience and ease of understanding, but that glass substrates may be substituted for all such references.

FIG. 1 is a top-view illustration of an embodiment of a multi-substrate processing system, wherein transport carriers support a line-array of substrates, but processing is performed on a two-dimensional array of substrates. In the system 100 illustrated in FIG. 1, the substrates are loaded and unloaded at load/unload station 105, i.e., from the same side of the system. However, it should be appreciated that the system may also be designed such that a loading station is provided on one side of the system, while an unloading station is provided on the opposite side of the system. In some embodiments, loading and/or unloading of substrates onto/from the carriers may be performed manually, while in others automation is provided to perform one or both of these tasks.

The substrates are loaded onto carriers positioned in load/unload station 105, and which were transported from carrier return station 110. Each carrier supports a linear array of substrates, i.e., two or more substrates arranged in a single row, in a direction perpendicular to the direction of travel inside the system. From load/unload station 105 the carriers are moved via the carrier return station 110 to buffer station 115. The carriers are parked in buffer station 115 until the low vacuum loadlock (LVLL) 120 is ready to accept them. In some embodiments, which will be described later, the buffer station also serves as the tilting station, wherein horizontally oriented carriers are tilted 90° to assume a vertical orientation. In such embodiments, clips are used to hold the substrate in place when assuming a vertical orientation.

At the proper time, valve 112 opens and the carriers positioned in buffer station 115 are transported into LVLL 120. Valve 112 is then closed and the LVLL 120 is evacuated to a rough vacuum level. Thereafter valve 113 opens and the carriers from LVLL 120 are transported into high vacuum loadlock (HVLL) 125. Once HVLL has been pumped to its vacuum level, valve 114 opens and the carriers from HVLL 125 are transported into processing chamber 130. The system may have any number of processing chambers 130 aligned linearly such that the carriers may be transported from one chamber to the next via a valve positioned between each two processing chambers. At the end of the last processing chamber, a valve is positioned that leads to the reverse loadlock arrangement as in the entrance to the system, i.e., first a HVLL and then a LVLL. Thereafter the carriers exit to the carrier return module 135 via valve 116. From return module 135 the carriers are returned to carrier return station 110 using, e.g., conveyor positioned above or below the processing chambers 130 (not shown).

As noted above, each carrier supports a linear array of substrates, which makes it easier to load and unload the substrates, and makes the carriers much easier to manufacture, handle, and transport. However, in order to have high throughput of the system, each processing chamber 130 is configured to house and simultaneously process a two-dimensional array of substrates positioned on several, i.e., two or more, carriers positioned one after the other. For better efficiency, in the particular embodiment of FIG. 1, buffer station 115, LVLL 120 and HVLL 125 are each configured to simultaneously house the same number of carrier as are simultaneously housed inside the processing chamber 130. For example, each carrier may support three glass substrates in one row, but each processing chamber is configured to process two carriers simultaneously, thus processing a two-dimensional array of 3×2 substrates.

According to other embodiments, the load locks and buffer chambers are sized to handle multiple carriers, e.g., two carriers, to provide for increased pump/vent, and pressure stabilization times. Also, a buffer chamber can be used to transition carrier motion from one of station to station motion to one of continues pass-by motion inside a processing chamber. For example, if one process chamber process carriers in stationary mode while the next chamber processes in pass-by mode, a buffer chamber may be placed between these two chambers. The carriers in the system create a continuous stream of carriers in the process chamber or module, and each process chamber/module may have 5-10 carriers continuously moving in a head to toe fashion past the process source (e.g., heat source, PVD, etch, etc).

As shown in FIG. 1, the parts of the system dedicated for transport, loading and unloading of substrates are positioned in atmospheric environment. On the other hand, all processing is performed in vacuum environment. Transport, loading and unloading in atmospheric environment is much easier than in vacuum.

FIG. 1A illustrates an example of a system, such as that shown in FIG. 1, wherein the carriers 200 remain in a horizontal orientation during transport and processing. The carriers are returned to the starting point via conveyor 140 positioned above the processing chambers. As shown in FIG. 1A, each carrier 200 supports four substrates 220 arranged linearly in one row. Also, for explanation purposes, the top part of chamber 120 is removed, so as to expose the arrangement of six carriers positioned simultaneously therein. Therefore, according to this embodiment, while each carrier supports four substrates, each chamber process twenty-four substrates simultaneously.

FIG. 1B illustrates an example wherein the carriers are horizontal during transport and loading/unloading, but are vertical during processing. The arrangement of FIG. 1B is very similar to that of FIG. 1A, except that the loadlock and processing chambers are flipped vertically, so as to process the substrates in a vertical orientation. The construction of loadlock and processing chambers in both embodiments of FIGS. 1A and 1B may be identical, except that in FIG. 1A they are mounted horizontally, while in FIG. 1B they are mounted on their side vertically. Consequently, the buffer stations 115 and the buffer station 145 on the other end of the system, are modified to include a lifting arrangement which changes the orientation of the carriers 90°, as shown in buffer station 145.

FIG. 2 illustrates a line-array carrier according to one embodiment, which may be configured for processing silicon wafers, glass substrates, etc. As shown in FIG. 2, the construction of the line-array carrier according to this embodiment is rather simple and inexpensive. It should be appreciated that the carrier can be configured for a different number of substrates and substrate size, by simply mounting different chucks on top of the carrier. Also, it should be appreciated that each processing chamber may be configured to accommodate several carriers simultaneously, thus processing multiple wafers on multiple carriers simultaneously.

The carrier 200 of FIG. 2 is constructed of a simple frame 205 which is formed by two transport rails 215 and two ceramic bars 210. The ceramic bar 210 improves thermal isolation of the susceptor (not shown) attached thereto from the remaining parts of the chamber. At least one side of each ceramic bar 210 forms a fork arrangement 235 with the transport rail 215, as shown in the callout. A cavity 245 is formed in the fork arrangement 235, such that the ceramic bar 210 is allowed to freely move (illustrated by the double-head arrow) due to thermal expansion, and not impart pressure on the transport rail 215.

A magnetic drive bar 240 is provided on each of the transport rails 225 to enable transporting the carrier throughout the system. The magnetic drive bars ride on magnetized wheels to transport the carrier. To enhance cleanliness of the system, the drive bars 240 may be nickel plated. This magnetic arrangement enables accurate transport without sliding of the carrier due to high accelerations. Also, this magnetic arrangement enables large spacing of the wheels, such that the carrier is attached to the wheels by magnetic forces and may cantilever to a large extent to traverse large gaps. Additionally, this magnetic arrangement enables transport of the carrier in either vertical or horizontal orientation, since the carrier is attached to the wheels by magnetic forces.

Carrier contact assembly 250 is attached to the transport rail 225 and mates with a chamber contact assembly 252 (see callout) attached to the chamber. The chamber contact assembly has an insulating bar 260 having a contact brush 262 embedded therein. The contact assembly 250 has a conductive extension 251 (FIG. 2A) that is inserted between an insulating spring 264 and insulting bar 260, thus being pressed against brush contact 264 so as to receive bias potential from the mating contact. The bias may be used for, e.g., substrate bias, substrate chucking (for electrostatic chuck), etc. The bias may be RF or DC (continuous or pulsed). The carrier contact assembly 250 may be provided on one or both sides of the carrier.

FIG. 2A is a partial cross-section showing how the carrier is transported and how it receives bias power. Specifically, FIG. 2A illustrates the drive bar 240 riding on three magnetized wheels 267, which are attached to shaft 268. Shaft 268 extends beyond the chamber wall 269, such that it is rotated from outside the interior vacuum environment of the chamber. The shaft 268 is coupled to a motor via flexible belt such as, e.g., an O-ring, to accommodate variations in shaft diameter.

FIG. 2B illustrates an example of carrier for processing silicon wafers, e.g., for fabricating solar cells. In FIG. 2B wafers 220 may be chucked to susceptor 223 using, e.g., chucking potential. A lifter 215 may be used to lift and lower the wafers for loading and unloading. FIG. 2C illustrates an embodiment wherein the carrier may be used for processing glass substrates such as, e.g., touchscreens. In this embodiment the substrates may be held in place using mechanical spring-loaded clamps or clips 227. The susceptor 224 may be a simple pallet with arrangement for the spring-loaded clips.

FIGS. 3A and 3B illustrate an embodiment for substrate loading and unloading mechanism, in conjunction with the carrier return. FIG. 3A is a top view of the load/unload mechanism, while FIG. 3B is a side view. As shown in FIG. 1A, a conveyor returns the carriers after completion of processing. The carriers are then lowered by elevator 107 and transported horizontally to the loading/unloading station 105. As shown in FIGS. 3A and 3B, a dual conveyor, i.e., conveyors 301 and 303, are used to bring fresh substrates for processing and remove processed wafers. It is rather immaterial which one brings the fresh wafers and which one removes the processed wafers, as the system would work exactly the same regardless. Also, in this embodiment it is shown that conveyors 301 and 303 transport substrates in the opposite direction, but the same result can be achieved when both conveyors travel in the same direction.

The arrangement of FIGS. 3A and 3B supports handling two carriers simultaneously. Specifically, in this embodiment processed substrates are unloaded from one carrier, while fresh substrates are loaded onto another carrier, simultaneously. Moreover, at the same time, processed substrates are deposited on the processed substrate conveyor and fresh substrates are picked-up from the fresh substrates conveyor, to be delivered to a carrier in the next round. This operation is performed as follows.

The substrate pick-up mechanism is configured to have two motions: rotational and vertical motions. Four rows of chucks 307 are attached to the substrate pick-up mechanism 305. The chucks 307 may be, for example, vacuum chucks, electrostatic chucks, etc. In this specific example, four rows of Bernoulli chucks are used, i.e., chucks that can hold a substrate using Bernoulli suction. The four rows of chucks are positioned two on each side, such that when two rows of chucks are aligned with the carriers, the other two rows are aligned with the conveyors. Thus, when the pick-up mechanism 305 is in its lowered position, one row of chucks picks up processed substrates from a carrier and another row deposits fresh substrates on another carrier, while on the other side one row of chucks deposit processed substrates on one conveyor and another row of chucks pick-up fresh substrate from the other conveyor. The pick-up mechanism 305 then assumes its elevated position and rotates 180 degrees, wherein at the same time the carriers move one pitch, i.e., the carrier with the fresh substrates move one step, the carrier from which processed substrates were removed moves into a fresh substrate loading position, and another carrier with processed substrates moves into the unloading position. The pick-up mechanism 305 then assumes its lowered position and the process is repeated.

To provide a concrete example, in the snapshot of FIG. 3A, carrier 311 has processed substrates which are being picked-up by one row of chucks on pick-up arrangement 305. Carrier 313 is being loaded with fresh substrates from another row of chucks of pick-up arrangement 305. On the other side of pick-up arrangement 305 one row of chucks is depositing processed substrates on conveyor 303, while another row of chucks is picking up fresh substrates from conveyor 301. When these actions have been completed, pick-up arrangement 305 is raised to its elevated position and is rotated 180 degrees, as shown by the curved arrow. At the same time, all of the carriers move one step, i.e., carrier 316 moves to the position previously occupied by carrier 317, carrier 313, now loaded with fresh substrates, moves to the spot previously occupied by carrier 316, carrier 311, now empty, moves to the spot previously occupied by carrier 313, and carrier 318, loaded with processed substrates moves into the spot previously occupied with carrier 311. Now the pick-up arrangement is lowered, such that carrier 311 is loaded with fresh substrates, processed substrates are removed from carrier 318, the substrates removed from carrier 311 are deposited onto conveyor 303, and fresh substrates are picked-up from conveyor 301. The pick-up arrangement 305 is then elevated, and the process repeats.

The embodiment of FIGS. 3A and 3B also utilizes an optional mask lifter arrangement 321. In this embodiment, masks are used to generate a required pattern on the surface of the substrate, i.e., expose certain areas of the substrate for processing, while covering other areas to prevent processing. The carrier travels through the system with the mask placed on top of the substrate until it reaches the mask lifer 321. When a carrier with processed substrates reaches the mask lifter (in FIGS. 3A and 3B, carrier 318), the mask lifter 321 assumes its elevated position and lifts the mask from the carrier. The carrier can then proceed to the unload station to unload its processed substrates. At the same time, a carrier with fresh substrates (in FIG. 3B carrier 319), movers into the mask lifter arrangement and mask lifter 321 assumes its lowered position so as to place the mask onto the fresh substrates for processing.

As can be appreciated, in the embodiment of FIGS. 3A and 3B, the mask lifter removes the masks from one carrier and places them on a different carrier. That is, the mask is not returned to the carrier from which it was removed, but is rather placed on a different carrier. Depending on the design and number of carriers in the system, it is possible that after several rounds a mask would be returned to the same carrier, but only after being lifted from another carrier. The converse is also true, i.e., depending on the design and the number of carriers and masks in service, it is possible that each mask would be used by all carriers in the system. That is, each carrier in the system would be used with each of the masks in the system, wherein at each cycle of processing through the system the carrier would use a different mask.

As shown in the callout, the carrier elevator may be implemented by having two vertical conveyor arrangements, one on each side of the carriers. Each conveyor arrangement is made of one or more conveyor belt 333, which is motivated by rollers 336. Lift pins 331 are attached to the belt 333, such that as the belt 333 moves, the pins 331 engage the carrier and move the carrier in the vertical direction (i.e., up or down, depending on which side of the system the elevator is positioned at and whether the carrier return conveyor is positioned over or below the processing chambers).

FIG. 3C illustrates an embodiment for substrate alignment mechanism. According to this embodiment, chuck 345 has spring loaded alignment pins 329 on one side and a notch 312 on the opposite side. A rotating push-pin 341 is configured to enter the notch 312 to push the substrate 320 against the alignment pin 329 and then retract, as illustrated by the dotted-line and rotational arrow. Notably, the rotating push-pin 341 is not part of the chuck 345 or the carrier and does not travel within the system, but is stationary. Also, the spring-loaded alignment pin is compressed to a lower position if a mask is used. Thus, a substrate alignment mechanism is provided which comprises a chuck having a first side configured with an alignment pin, a second side orthogonal to the first side and configured with two alignment pins, a third side opposite the first side and configured with a first notch, and a fourth side opposite the second side and configured with a second notch; the alignment mechanism further comprising a first push-pin configured to enter the first notch to push the substrate against the first alignment pin, and a second push-pin configured to enter the second notch and push the substrate against the two alignment pins.

FIG. 4 illustrates an embodiment of a vacuum processing chamber 400 that may be used with the disclosed system. In the illustration of FIG. 4, the lid of the chamber is removed to expose its internal construction. The chamber 400 may be installed in a horizontal or vertical orientation, without any modifications to its constituents or its construction. The chamber is constructed of a simple box frame with openings 422 for vacuum pumping. An entry opening 412 is cut in one sidewall, while an exit opening 413 is cut in the opposite sidewall, to enable the carrier 424 to enter the chamber, traverse the entire chamber, and exit the chamber from the other side. Gate valves are provided at each opening 412 and 413, although for clarity in the illustration of FIG. 4 only gate valve 414 is shown.

To enable efficient and accurate transport of the carrier 424 in a horizontal and vertical orientation, magnetic wheels 402 are provided on the opposing sidewall of the chamber. The carrier has magnetic bars that ride on the magnetic wheels 402. The shafts upon which the wheels 402 are mounted extend outside the chamber into an atmospheric environment, wherein they are motivated by motor 401. Specifically, several motors 401 are provided, each motivating several shafts using belts, e.g., O-rings. Also, idler wheels 404 are provided to confine the carriers laterally.

A feature of the embodiment of FIG. 4 is that the diameter of the magnetic wheels is smaller than the chamber's sidewall thickness. This enables placing magnetic wheels inside the inlet and outlet openings 412 and 413, as shown by wheels 406 and 407. Placing wheels 406 and 407 inside the inlet and outlet opening 412 and 413 enables smoother transfer of the carriers into and out of the chamber, as it minimizes the gap that the carriers have to traverse without support from wheels.

Figure 5:
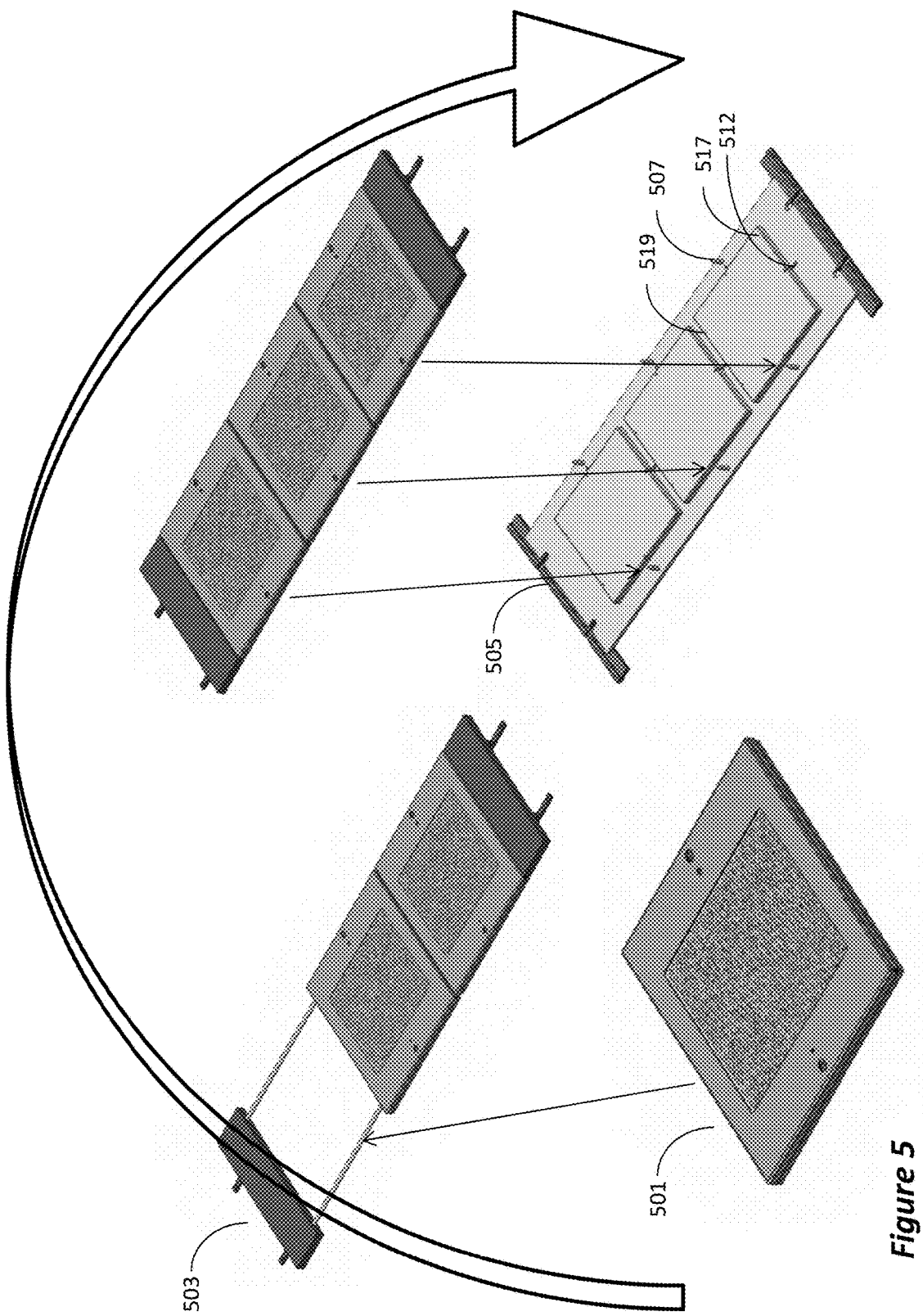
FIG. 5 illustrates an embodiment for a mask and carrier assembly.

FIG. 5 illustrates an embodiment for a mask and carrier assembly. Progressing from left to right along the curved arrow, a single-substrate mask assembly 501 is mounted onto a mask carrier 503, supporting several mask assemblies; and the mask carrier 503 is mounted onto a substrate carrier 505. In one embodiment, springs between the floating mask assemblies 501 keep them in place for engagement with guide pins 507, provided on the substrate carriers 505, such that each mask is aligned to its respective substrate. Each single-substrate mask assembly is constructed of an inner foil mask that is cheap and capable of many repeated uses. The foil mask is made of s flat sheet of magnetic material with perforations according to a desired design. An outer mask covers and protects the inner mask by taking the heat load, so that the foil mask does not distort. An aperture in the outer mask exposes the area of the inner mask having the perforations. A frame holds the inner and outer masks onto the mask carrier 503. Magnets embedded in the substrate carrier 505 pull the inner foil mask into contact with substrate.

Each substrate support, e.g., mechanical or electrostatic chuck, 517 supports a single substrate. The individual chucks 517 can be changed to support different types and/or sizes of substrates, such that the same system can be used to process different sizes and types of substrates. In this embodiment the chuck 517 has substrate alignment pins 519 which are retractable, and provisions to align the substrate on top of the chuck. In this embodiment, the provisions to enable alignment consist of a slit 512 accommodating a retractable pin that pushes the substrate against alignment pins 519 and then retracts out of the slit 512. This allows for aligning the substrate and the mask to the substrate carrier, such that the mask is aligned to the substrate.

As can be understood, the system described thus far is inexpensive to manufacture and provide efficient vacuum processing of various substrates, such as, e.g., solar cells, touchscreens, etc. The system can be configured with double or single end loading and unloading, i.e., substrate loading and unloading from one side, or loading from one side and unloading from the opposite side. No substrate handling is performed in vacuum. The system is modular, in that as many vacuum processing chambers as needed may be installed between the input and output loadlocks. The vacuum chambers have a simple design with few parts in vacuum. The vacuum chambers may be installed in a horizontal or vertical orientation. For example, for solar cell processing the system may process the substrates in a horizontal orientation, while for touchscreens the substrates may be processed in a vertical orientation. Regardless, loading, unloading and transport in atmospheric environment is done with the substrates in a horizontal orientation. The processing sources, e.g., sputtering sources, may be installed above and/or below the substrates. The system is capable of pass-by or static processes, i.e., with the substrate stationary or moving during vacuum processing. The chambers may accommodate sputtering sources, heaters, implant beam sources, ion etch sources, etc.

For solar applications the vacuum chamber may include a low energy implanter (e.g., less than 15 KV). For specific solar cell design, such as PERC, IBC or SE, the mask arrangement may be used to perform masked implant. Also, texture etch may be performed with or without mask, using an ion etch source or laser assisted etch. For point contact cells, masks with many holes aligned to the contacts can be used. Also, thick metal layers can be formed by serially aligning several PVD chambers and forming layers one over the other serially.

For touch panel applications, the chambers may be used to deposit cold and/or hot ITO layers using PVD sources. The processing is performed with several, e.g., three touch panels arranged widthwise on each carrier, and several, e.g., two, carriers positioned inside each chamber simultaneously for higher throughput but simpler handling. The same system can handle touchscreens for pads or cellphone size glass without any internal reconfigurations. Simply, the appropriate carrier is configured and the entire system remains the same. Again, no substrate handling is performed in vacuum.

The handling and processing operations can be the same for all types and sizes of substrates. An empty carrier moves to load from carrier return elevator. If a mask is used, the mask is removed and stays at the elevator. Substrates are loaded onto the carrier in atmospheric environment. The carrier moves back to the elevator and the masks are placed on top of the substrates. The carrier then moves into the load lock. In vacuum the carrier transport is via simple magnetic wheels positioned in chamber wall and energized from outside the chamber in atmospheric or vacuum environment. The chambers can have valves for isolation, and can have sources above or in a drawer for process below the substrates. The substrates can be removed at an unload end of the system, or left on carriers to return to the loading end, i.e., entry side of the system. Carriers return on simple conveyor belt from process end of the system to load end of the system. Simple pin conveyor lifts or lowers the carriers to or from load and unload stations.

Figure 6A:
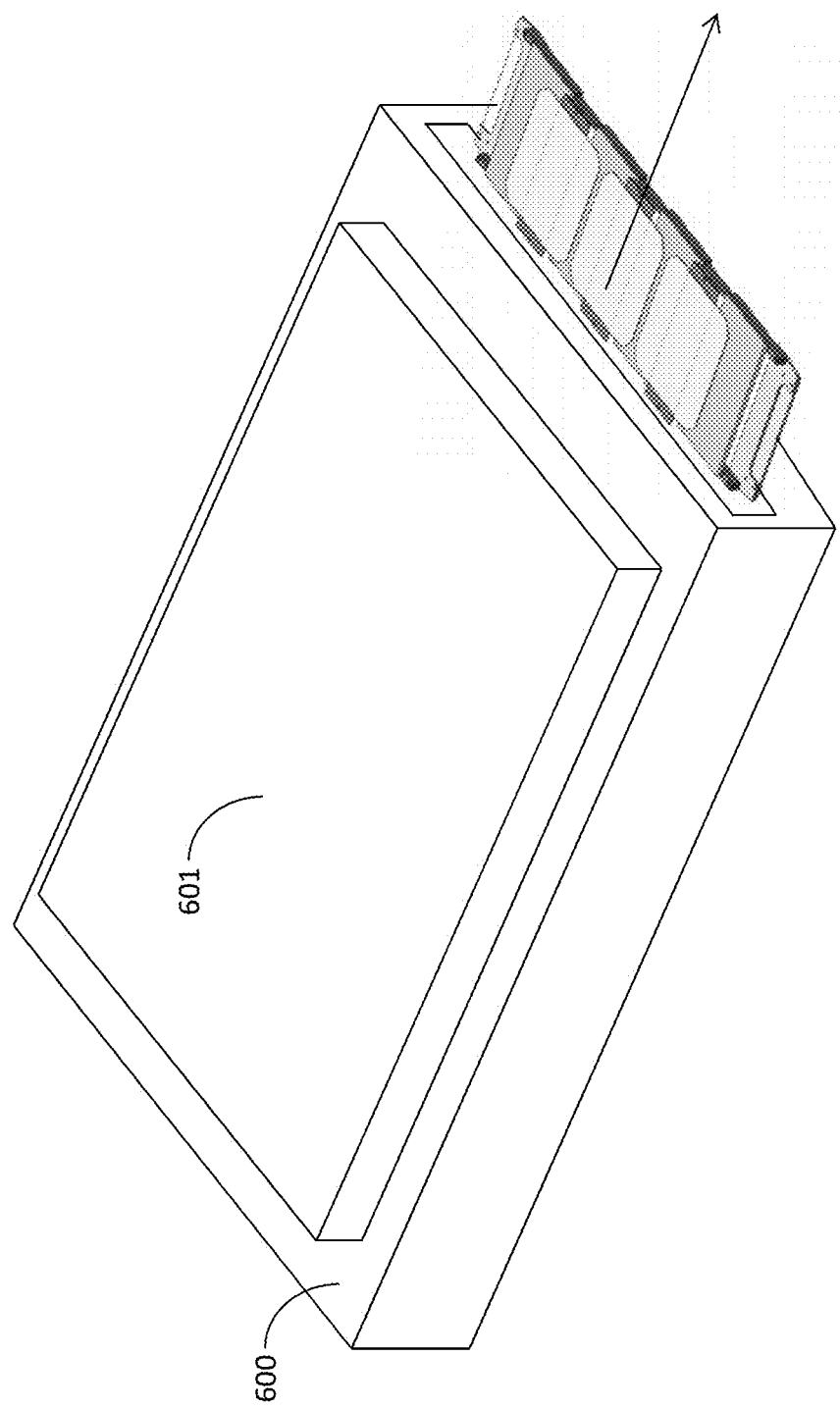
FIGS. 6A-6C illustrate three embodiments demonstrating how the vacuum chamber can be fitted with different processing sources of varying sizes and configurations.
Figure 6B:
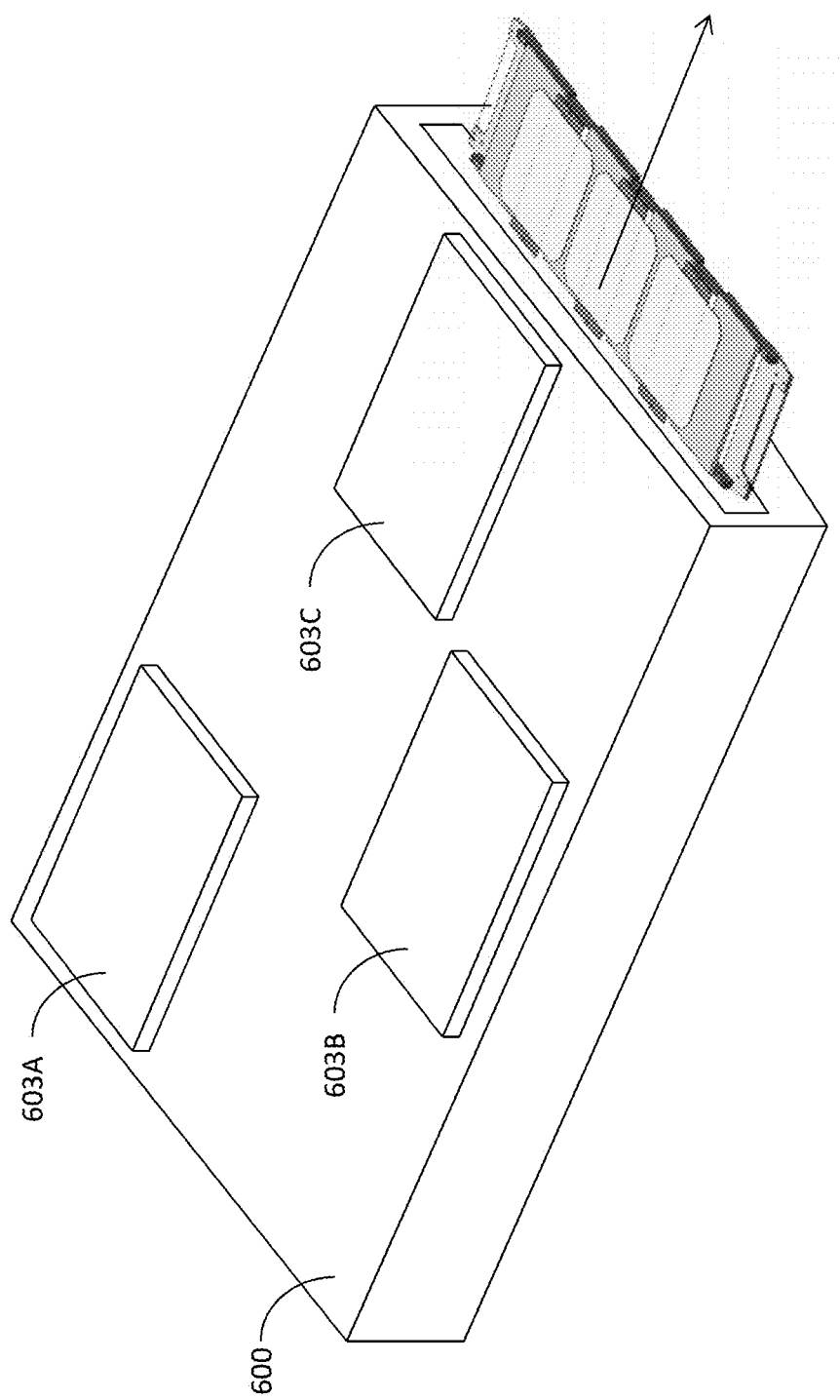
Figure 6C:
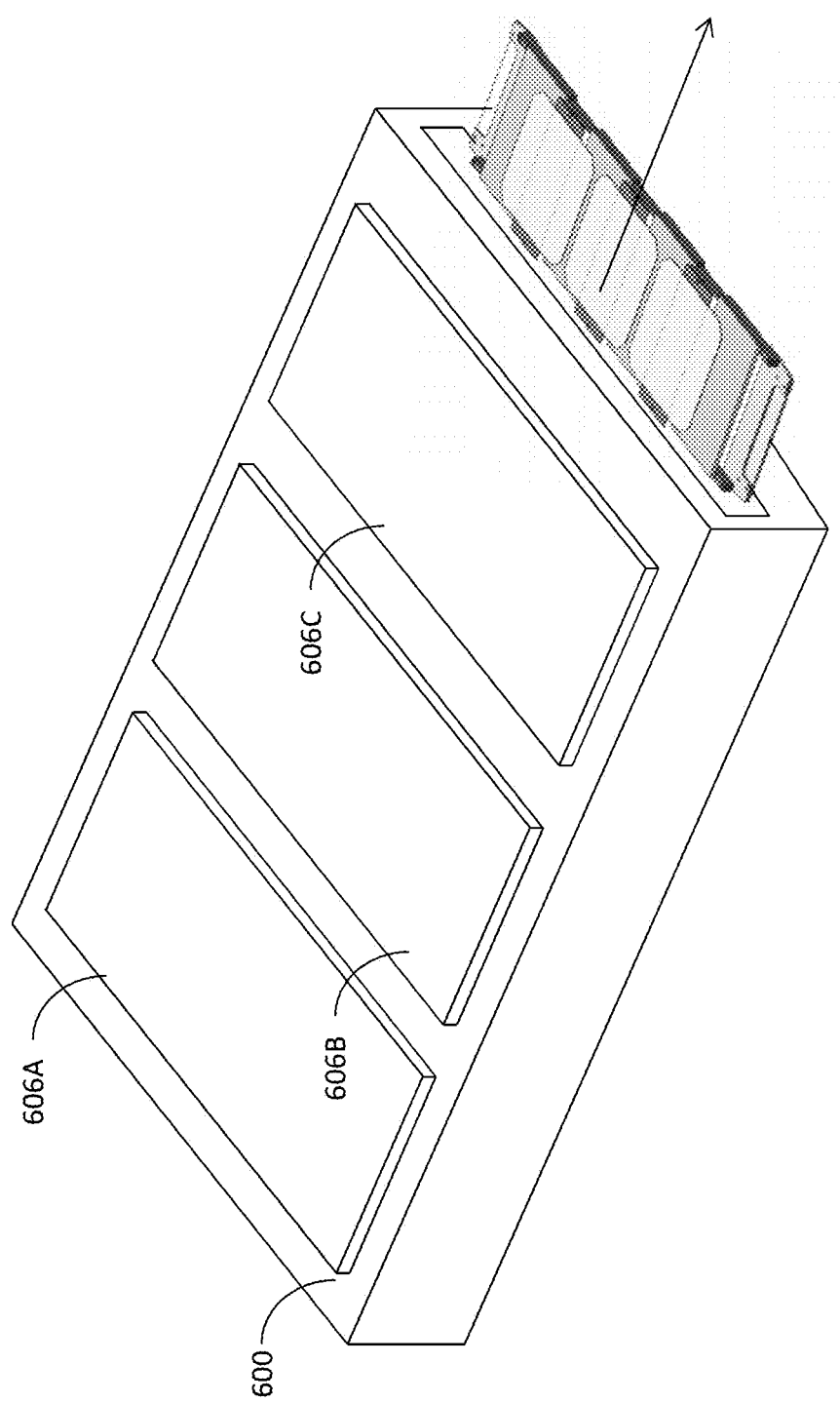

FIGS. 6A-6C illustrate three embodiments demonstrating how the vacuum chamber can be fitted with different processing sources of varying sizes and configurations. In the examples of FIGS. 6A-6C it is assumed that the substrates are arrange three-wide, but of course more or less substrates can be arranged on a carrier widthwise. Also, in FIGS. 6A-6C it is assumed that the processing chamber can accommodate several carriers, e.g., two or three, for simultaneous processing. The sources illustrated in FIGS. 6A-6C may be any processing sources, such as, e.g., PVD, etch, implant, etc.

FIG. 6A illustrates an embodiment wherein a single source 601 is provided on chamber 600. This single source is used to process all of the substrates positioned inside the chamber 600. The source 601 may have length and/or width that covers all of the substrates simultaneously. For some sources, it may be too complicated or too expensive to fabricate a single source with such a large size. For example, if source 601 is a sputtering source, the target must be made very large, which is expensive, complicated, and leads to under-utilization. Therefore, according to the embodiments of FIGS. 6B and 6C several smaller sources are used. In the embodiment of FIG. 6B each of the sources 603A-603C is wide enough to cover only a single substrate, but it may cover more than one substrate lengthwise, i.e., in the direction of substrate travel. By staggering the sources such that each source covers only one of the substrate in each carrier, all of the substrates can be processed. Such an arrangement is particularly suitable for pass-by processing. Conversely, in the embodiment of FIG. 6C each of the sources 606A-606C is wide enough to cover all of the substrates in one carrier, i.e., in a direction perpendicular to the substrate travel direction, but is too narrow to cover all of the substrates positioned within the chamber. In fact, in some embodiments each of the sources 606A-606C is even narrower than one substrate. Such an arrangement is equally suitable for pass-by or static processing.

The embodiments described above provide for a vacuum processing chamber having a vacuum housing sized for housing and processing several substrate carriers simultaneously. The housing is also configured for supporting several processing sources simultaneously. The processing sources may be, e.g., sputtering sources, which may be narrow sources having length sufficient to traverse all substrates held by a substrate carrier, but may be narrower than the width of a substrate positioned on the carrier. Several such sources may be positioned back-to-back over the entire or part of the length of the chamber in the travel direction of the carrier. The chamber has several shafts positioned on two opposing sides to transport the carriers inside the chamber. Each shaft is rotated by a flexible belt that is motivated by a motor. Each shaft has several magnetic wheels positioned thereupon in alternating pole order, i.e., while one wheel may have its outside circumference magnetized south and inside diameter magnetized north, the neighboring wheel would have its outer circumference magnetized north and inside diameter magnetized south. The chamber also has an entry sidewall having an inlet opening and an exit sidewall opposite the entry sidewall and having an outlet opening; wherein a magnetized wheel arrangement is positioned inside the entry sidewall and protruding into the inlet opening and having a magnetized wheel arrangement positioned inside the exit sidewall and protruding into the outlet opening, so as to drive the substrate carriers passing through the inlet and outlet openings.

The disclosed system is a linear system wherein the chambers are arranged linearly, one chamber coupled to the next, such that substrate carriers enter the system from one side, traverse all the chambers in a linear fashion, and exit the system on the opposite side. The carriers move from one chamber directly to the next via valve gates separating the chambers. Once a carrier exits the vacuum environment of the system, it enters an elevator and is moved vertically to a return conveyor, which transport the carrier horizontally back to the entry side of the system, wherein it enters another elevator and is moved vertically to be loaded with fresh substrates and enter the vacuum environment of the system again. While the carrier is transported in atmospheric environment it is held in a horizontal orientation. However, in one embodiment, when the carrier enters the vacuum environment it is rotated to a vertical orientation, such that the substrates are processed while held in a vertical orientation.

The system may have a loading and unloading station positioned at the entry side of the system. The loading and unloading system has a rotating structure upon which four rows of chucks are positioned, two rows on each side of the rotation axis. On each side of the rotation axis one row of chucks is configured for unloading processed substrates and one row of chucks is configured for loading fresh substrates. The rotating structure is configured for vertical motions, wherein when it assumes its lower position the structure picks-up substrates and when it assumes its elevated position the structure rotates 180 degrees. Also, when the structure is in its lowered position, on each side of the rotation axis one row of chucks picks-up substrates while the other row of chucks deposits, i.e., releases, its substrates. In one embodiment, two conveyors are provided across the entry to the system, wherein one conveyor delivers fresh substrates while the other conveyor removes processed substrates. The rotating structure is configures such that in its lower position one row of chucks is aligned with the conveyor delivering fresh substrates while the other row of chucks is aligned with the conveyor removing processed substrates. Simultaneously, on the other side of the rotation axis, one row of chucks is aligned with an empty carrier while the other row of chucks is aligned with a carrier holding processed substrates.

In some embodiments provisions are made to apply potential to the substrates. Specifically, each carrier includes a conductive strip that, when the carrier enters a processing chamber, is inserted into a sliding contact comprising an elongated contact brush and a conformal insulating spring that is configured to press the conductive strip against the elongated contact brush. An insulating strip, such as a Kapton strip, can be used to attach the conductive strip to the carrier.

When processing of the substrates requires the use of masks, the masks may be placed individually on top of each substrate, or one mask may be formed to cover all substrates of one carrier simultaneously. The mask may be held in place using, e.g., magnets. However, for accurate processing the mask must be made very thin, and consequently may deform due to thermal stresses during processing. Additionally, a thin mask may collect deposits rapidly and the deposits may interfere with the accurate placing and masking of the mask. Therefore, it would be advantageous to use the dual-mask arrangement according to the embodiments disclosed below.

Figure 7A:
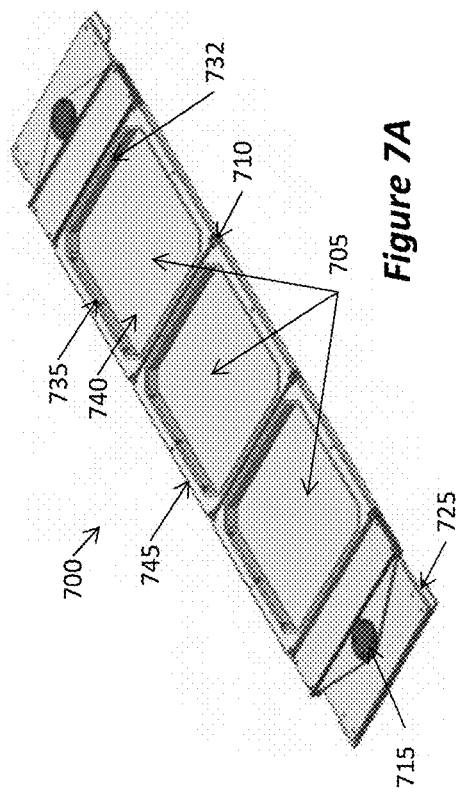
FIGS. 7A-7E illustrate views of a multi-wafer carrier having an arrangement for dual-mask, according to various embodiments.
Figure 7C:
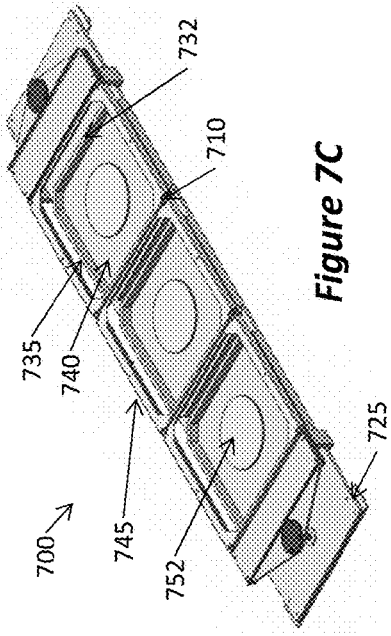
Figure 7B:
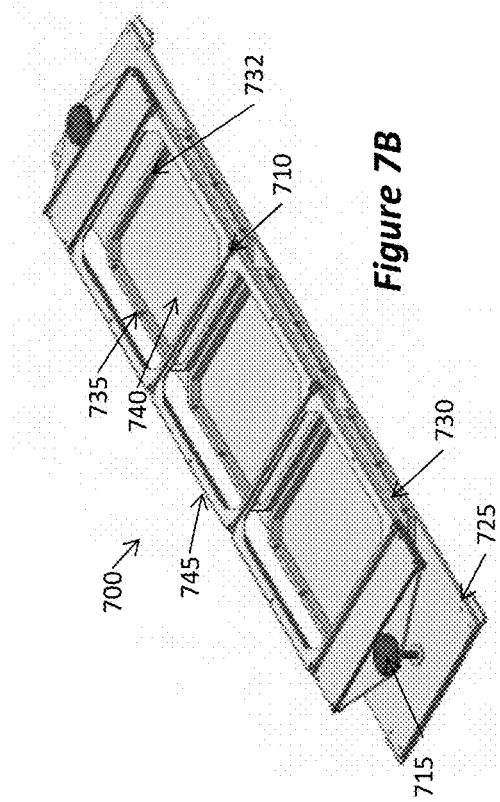
Figure 7D:
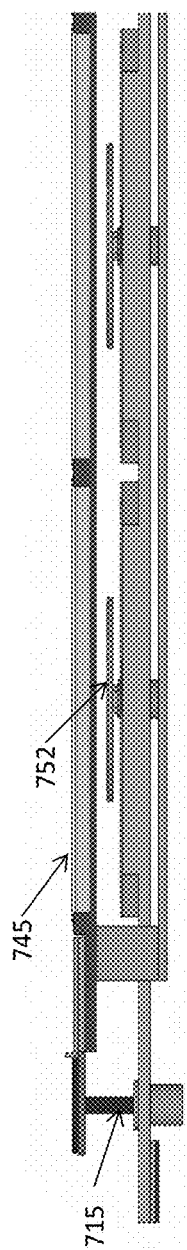
Figure 7E:
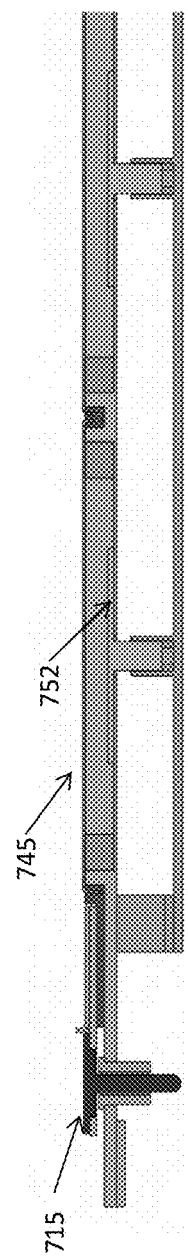

FIGS. 7A-7E illustrate views of a multi-wafer carrier having an arrangement for dual-mask, according to various embodiments. FIG. 7A illustrates a multi-wafer carrier with dual-masks arrangement, wherein the mask arrangement is in the lower position such that the inner mask is in intimate physical contact with the wafer; FIG. 7B illustrates a multi-wafer carrier with dual-masks arrangement, wherein the mask arrangement is in the elevated position thereby enabling replacement of the wafers; FIG. 7C illustrates a multi-wafer carrier with dual-masks arrangement, wherein wafer lifters are included for loading/unloading wafers; FIG. 7D illustrates a partial cross-section of a multi-wafer carrier with dual-masks arrangement, wherein the mask arrangement and the wafer lifters are in the elevated position; and FIG. 7E illustrates a partial cross-section of a multi-wafer carrier with dual-masks arrangement, wherein the mask arrangement and the wafer lifter are in the lower position.

Referring to FIG. 7A, the multi-wafer carrier, also referred to as carrier support 700 has three separate single-wafer carriers or susceptors 705, which are supported by a susceptor frame or bars 710, made of, e.g., ceramic. Each single-wafer carrier 705 is configured for holding a single wafer together with a dual-mask arrangement. In FIG. 7A the dual-mask arrangement is in a lowered position, but no wafer is situated in any of the carriers, so as to expose the carriers' construction. In FIG. 7B the dual-mask arrangement is shown in the lifted position, again without wafers in any of the carriers. In the embodiments of FIGS. 7A-7E a lifter 715 is used to lift and lower the dual-mask arrangement; however, for lower cost and less complication, lifter 715 may be eliminated and the dual-mask arrangement may be lifted manually. Transport rails 725 are provided on each side of the frames 710, to enable transporting the carrier 700 throughout the system.

Each of single-wafer carriers 705 has a base 730 (visible in FIG. 7B), which has a raised frame 732 with a recess 735 to support a wafer suspended by its periphery. The base 730 with the frame 732 form a pocket 740 below the suspended wafer, which is beneficial for capturing broken wafer pieces. In some embodiments, the frame 732 is separable from the base 730. Outer mask 745 is configured to be mounted on the frame 732, so as to cover the frame 732 and cover the periphery of the inner mask, but expose the central part of the inner mask which corresponds to the wafer. This is exemplified by the cross-section illustration in the embodiment of FIG. 8.

Figure 10:
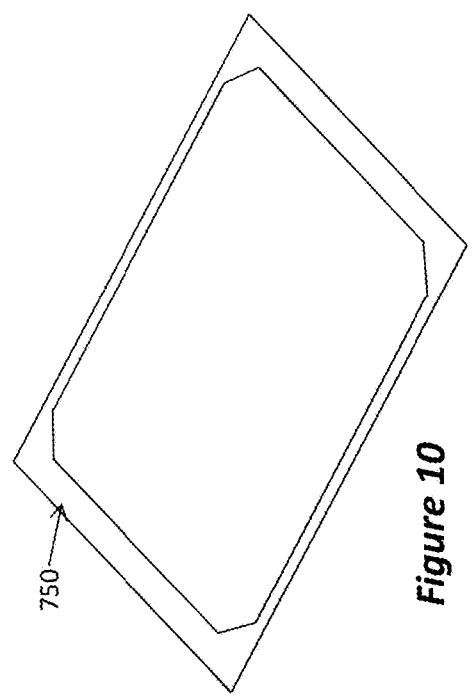
FIG. 10 illustrates an embodiment of the inner mask for use in edge isolation.
Figure 9:
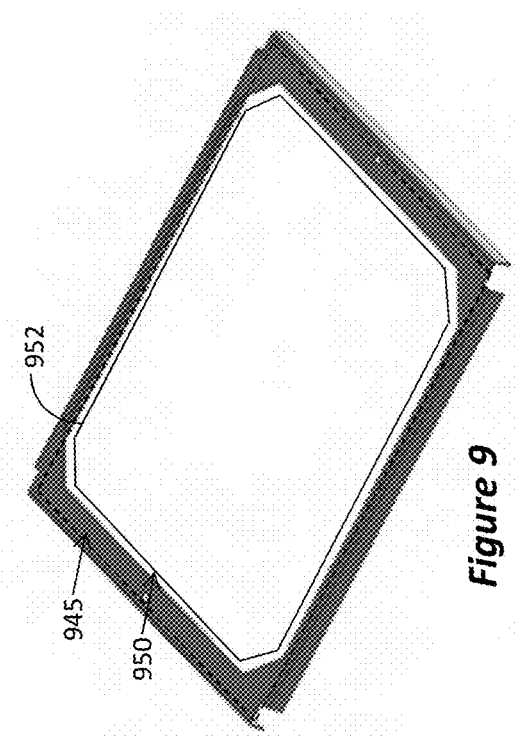
FIG. 9 illustrates an embodiment of the outer mask, with the inner mask nested therein.

In FIG. 8, base or susceptor 805 has raised frame 830 with recess 832, which supports wafer 820 at its periphery. The base 805 with frame 830 forms pocket 840, and the wafer is suspended above the pocket. A series of magnets 834 are positioned inside the raised frame 830, so as to surround the periphery of the wafer 820. In some embodiments, especially for high temperature operations, the magnets 834 may be made of Samarium Cobalt (SmCo). Inner mask 850 is positioned on top of the raised frame 830 and the wafer 820, and is held in place by magnets 834, such that it physically contacts the wafer. Outer mask 845 is placed over and physically contacts the inner mask 850, such that it covers the periphery of the inner mask 850, except for the area of the inner masks that is designed for imparting the process to the wafer. An example of outer mask 945 is shown in FIG. 9, in this example made of a folded sheet of aluminum, wherein the inner mask is covered by the outer mask, except for a small peripheral edge 952, since the example is for an edge shunt isolation processing. An example of the inner mask 750 for edge shunt isolation is illustrated in FIG. 10, which is basically a flat sheet of metal having an aperture of size and shape as that of the wafer, except that it is slightly smaller, e.g., 1-2 mm smaller than the size of the wafer. In the embodiment of FIG. 8, mask frame 836 is provided to enable supporting and lifting of the inner and outer mask off of the carrier. In such a configuration, the outer mask is sandwiched between the mask frame 836 and the inner mask 850.

Figure 8A:
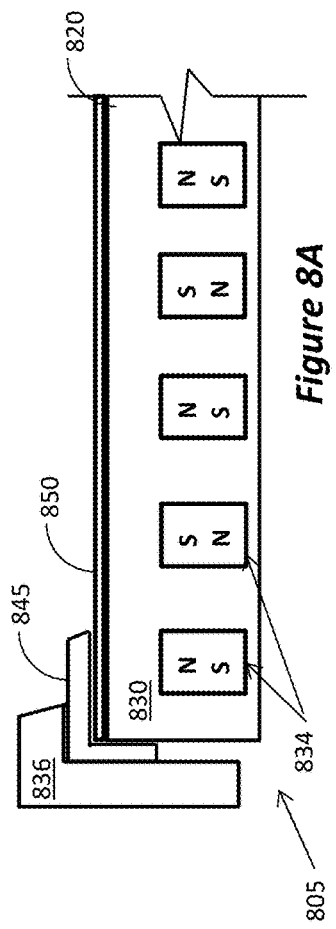
FIG. 8A is a cross section of an enlarged part of the frame, outer and inner masks, according to anther embodiment.

FIG. 8A illustrates another embodiment, which may be used, for example, for forming contact patterns on the back of a wafer. In this embodiment, the susceptor forms a top platform to support the wafer on its entire surface. Magnets 834 are embedded over the entire area of the suscpetor below the top surface of the susceptor. The inner mask 850 covers the entire surface of the wafer 820 and has plurality of holes according to the contact design.

Turning back to FIGS. 7A-7E, lifter 715 can be used to raise the outer mask, together with the inner mask. Also, wafer lifter 752 can be used to lift the wafer off of the frame 730, so that it could be replaced with a fresh wafer for processing, using a robot arm. However, lifters 715 and 752 can be eliminated and the operations of lifting the masks and replacing the wafer may be done manually instead.

In the embodiments described above with reference to FIG. 8, the carrier supports the wafer on its peripheral edge, such that the wafer is suspended. The pocket formed below the wafer traps broken wafer pieces and prevents wrap-around of deposited material. On the other hand, in the embodiment of FIG. 8A the wafer is supported over its entire surface. The mask assembly is lowered in place for sputter or other form of processing, and is lifted, manually or mechanically, for loading and unloading of wafers. A series of magnets on the carrier help secure the inner mask in place and in tight contact with the wafer. After repeated uses, the outer and inner masks can be replaced, while the rest of the carrier assembly can be reused. The frame 810, also referred to as mask assembly side bars, may be made from low thermal expansion material, such as Alumina or Titanium.

According to the above embodiments, the inner mask establishes an intimate gap free contact with the substrate. The outer mask protects the inner mask, the carrier and the frame from deposited material. In the embodiments illustrated, the outer and inner mask openings are in a pseudo-square shape, suitable for applications to mono-crystalline solar cells during edge shunt isolation process. During other processes the inner mask has a certain apertures arrangement, while the outer mask has the pseudo-square shaped aperture. Pseudo-square shape is a square with its corners cut according to a circular ingot from which the wafer was cut. Of course, if poly-crystalline square wafers are used, the outer and inner mask openings would be square as well.

FIG. 11 illustrate an embodiment of the single wafer carrier 1105. The wafer rests at its periphery on recess 1132.

Magnets 1134, shown in broken line, are provided inside the carrier all around the wafer. Alignment pins 1160 are used to align the outer mask to the carrier 1105. An embodiment of the outer mask is shown in FIG. 12, viewing from the underside. The outer mask 1245 has alignment holes or recesses 1262 corresponding to the alignment pins 1260 of the carrier 1205.

Figure 13:
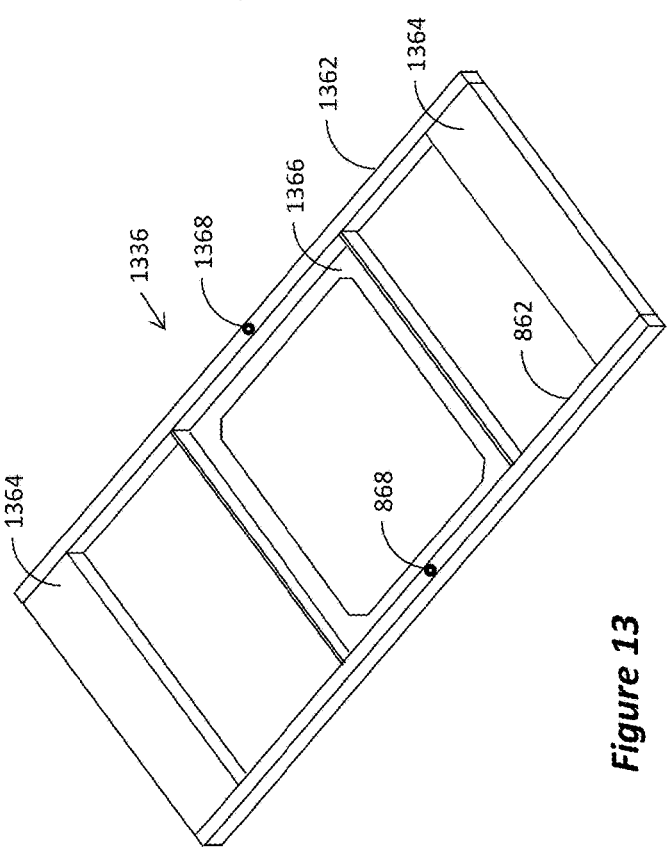
FIG. 13 illustrates an embodiment of a top frame to support the inner and outer masks.

FIG. 13 illustrates an embodiment of a top frame 1336 used to hold the outer and inner masks and secure the masks to the susceptor. The top frame 1336 may be made by, e.g., two longitudinal bars 1362, held together by two traverse bars 1364. The outer mask is held inside pocket 1366. Alignment holes 1368 are provided to align the top frame to the susceptor.

Figure 14:
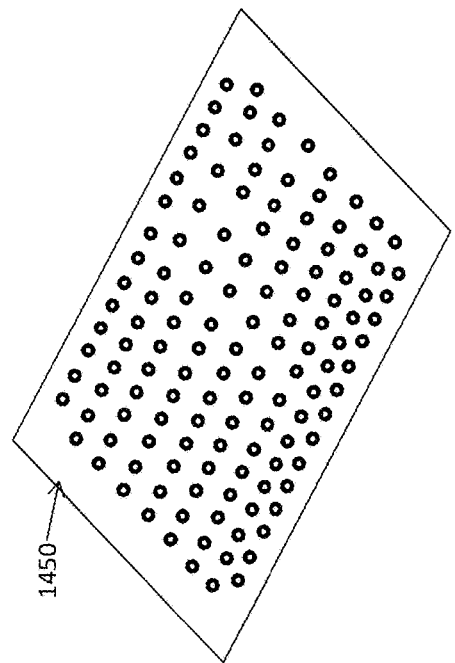
FIG. 14 illustrates an embodiment of the inner mask for creating plurality of holes in the wafer.
Figure 15:
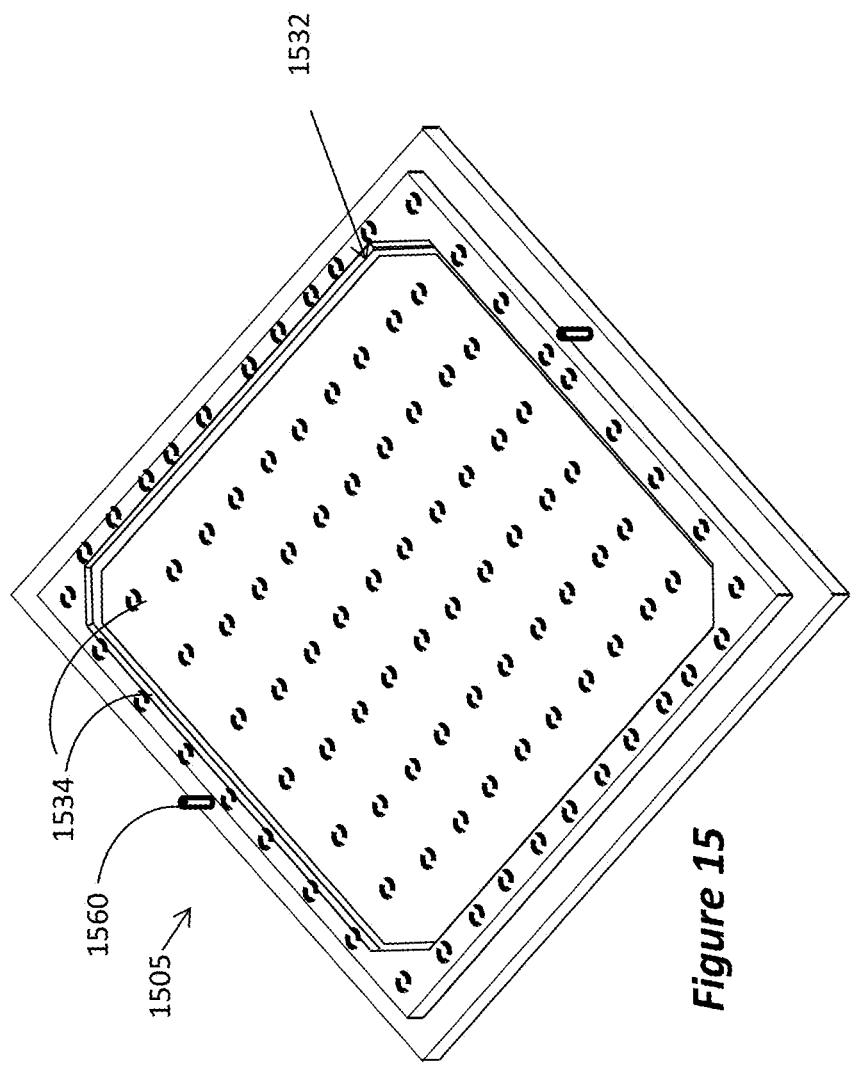
FIG. 15 illustrates an embodiment of the susceptor for use with the mask of FIG. 9.

FIG. 14 illustrates an example of an inner mask with a hole-pattern designed, for example, for fabricating plurality of contacts on the wafer. Such an inner mask can be used with the susceptor shown in FIG. 15, wherein the magnets 1534 are distributed over the entire area below the surface of the wafer. The magnets are oriented in alternating polarization.

An upper or outer mask may be made from thin, e.g., about 0.03", aluminum, steel or other similar material, and is configured to mate with a substrate carrier. An inner mask is made from a very thin, e.g., about 0.001 to 0.003", flat steel sheet, or other magnetic materials, and is configured to be nested within the outer mask.

According to further embodiments, arrangement for supporting wafers during processing is provided, comprising: a wafer carrier or susceptor having a raised frame, the raised frame having a recess for supporting a wafer around periphery of the wafer and confining the wafer to predetermined position; an inner mask configured for placing on top of the raised frame, the inner mask having an aperture arrangement configured to mask part of the wafer and expose remaining part of the wafer; and an outer mask configured for placing over the raised frame on top of the inner mask, the outer mask having a single opening configured to partially cover the inner mask. A top frame carrier may be used to hold the inner and outer mask and affix the inner and outer masks to the wafer susceptor.

Magnets are located in the susceptor and alternate N-S-N-S-N completely around the frame or completely below the entire surface of the susceptor and directly under the wafer. The outer and inner masks are designed to be held to the frame by magnetic forces only, so as to enable easy and fast loading and unloading of substrates.

The mask assembly is removable from the wafer carrier and support frame to load the substrate into the carrier. Both the outer and inner masks are lifted as part of the mask assembly. Once the wafer is located on the carrier in the wafer pocket, the mask assembly is lowered back down onto the carrier. The inner mask overlaps the top surface of the wafer. The magnets in the carrier frame pull the inner mask down into intimate contact with the substrate. This forms a tight compliant seal on the edge of the wafer. The outer mask is designed in order to prevent deposition on the thin compliant inner mask. As explained above, the deposition process might cause the inner mask to heat, causing the mask to warp and loose contact with the wafer. If the mask looses contact with the wafer the metal film will deposit in the exclusion zone on the surface of the substrate wafer. The pocket and friction force created by the magnets keep the substrate and mask from moving relative to each other during transport and deposition, and the outer mask prevents film deposition on the inner mask and prevents the inner mask from warping.

The mask assembly can be periodically removed from the system with the carrier by use of a vacuum carrier exchange. The carrier exchange is a portable vacuum enclosure with carrier transport mechanism. It allows the carriers to be exchanged "on the fly" without stopping the continuous operation of the system.

While this invention has been discussed in terms of exemplary embodiments of specific materials, and specific steps, it should be understood by those skilled in the art that variations of these specific examples may be made and/or used and that such structures and methods will follow from the understanding imparted by the practices described and illustrated as well as the discussions of operations as to facilitate modifications that may be made without departing from the scope of the invention defined by the appended claims.

The invention claimed is:

1. A system for processing wafers in a vacuum processing chamber, comprising:
   a plurality of carriers, each carrier comprising a frame having a plurality of openings, each opening configured to accommodate a single wafer;
   a transport mechanism configured to transport the plurality of carriers through a loading station, to the vacuum processing chamber, and to an unloading station;
   a return mechanism configured to return empty carriers from the unloading station to the loading station in an atmospheric environment, the return mechanism comprising a first carrier elevator positioned in the unloading station, a second carrier elevator positioned in the loading station, and a conveyor between the first and second carrier elevators;
   a plurality of susceptors, each susceptor configured for supporting a single wafer;
   an attachment mechanism for attaching a plurality of susceptors to each of the carriers, wherein each of the susceptors is attached to a corresponding position at an underside of a corresponding carrier, such that a wafer positioned on one of the susceptors is situated within one of the plurality of opening in the carrier;
   a plurality of masks, each mask attached over front side of one of the plurality of opening in the carrier;
   an alignment mechanism, configured to align the wafers to the masks;
   a lifter configured for separating the susceptors from the carrier and masks;
   wherein said plurality of masks comprise:
   a plurality of inner masks, each configured for placing on top of one of the plurality of opening in the carrier, the inner mask having an opening-pattern to mask parts of the wafer and expose remaining parts of the wafer; and,
   a plurality of outer masks, each configured for placing on top of a corresponding inner mask, the outer mask having an opening configured to partially cover the inner mask.

2. The system of claim 1, wherein the inner mask is made of magnetic material and the outer mask is made of aluminum.

3. The system of claim 1, further comprising a pocket configured for capturing broken wafer pieces.

4. A system for processing wafers in a vacuum processing chamber, comprising:
   a plurality of carriers, each carrier comprising a frame having a plurality of openings, each opening configured to accommodate a single wafer;

a transport mechanism configured to transport the plurality of carriers through a loading station, to the vacuum processing chamber, and to an unloading station;

a return mechanism configured to return empty carriers from the unloading station to the loading station in an atmospheric environment, the return mechanism comprising a first carrier elevator positioned in the unloading station, a second carrier elevator positioned in the loading station, and a conveyor between the first and second carrier elevators, a plurality of susceptors, each susceptor configured for supporting a single wafer;

an attachment mechanism for attaching a plurality of susceptors to each of the carriers, wherein each of the susceptors is attached to a corresponding position at an underside of a corresponding carrier, such that a wafer positioned on one of the susceptors is situated within one of the plurality of opening in the carrier;

a plurality of masks, each mask attached over front side of one of the plurality of opening in the carrier;

an alignment mechanism, configured to align the wafers to the masks;

a lifter configured for separating the susceptors from the carrier and masks;

wherein the attachment mechanism comprises a plurality of magnets attached to the susceptor and arranged to surround periphery of the wafer.

5. A system for processing wafers, comprising:

a plurality of susceptors, each susceptor configured for supporting a single wafer;

a plurality of masks assemblies;

a plurality of carriers, each carrier configured to supporting a plurality of susceptors and a plurality of the mask assemblies, each mask assembly positioned above one of the susceptors;

a loading station having a loading mechanism to load wafers onto susceptors;

an alignment station having an alignment mechanism to align wafers on individual susceptors;

an unloading station having an unloading mechanism to unload wafers from the susceptors, and having an elevator to transfer carriers from the unloading station to a carrier return conveyor;

at least one vacuum processing chamber situated between the alignment station and the unloading station;

a transport mechanism configured to continuously transport the plurality of carriers from the loading station, to the vacuum processing chamber, to the unloading station, and back to the loading station;

a lifter configured from lifting and lowering the mask arrangements to enable loading of wafers onto the susceptors.

6. The system of claim 5, wherein each mask assembly comprises an inner mask and an outer mask and wherein the carrier comprises an opening enabling the inner mask to physically contact a corresponding wafer.

7. The system of claim 5, wherein each susceptor comprises a base and a raised frame, wherein the base and the frame form a pocket thereby suspending the wafer above the pocket.

8. The system of claim 7, wherein a plurality of magnets are positioned inside the raised frame.

9. The system of claim 8, wherein the magnets are oriented in alternating polarization completely around the frame.

10. A method for processing wafers in a vacuum processing chamber, comprising:

affixing a plurality of masks on a top surface of a carrier, each mask overlying an opening in the carrier;

loading a plurality of wafers onto a plurality of susceptors, each wafer loaded onto a single susceptor;

aligning each of the masks to each of the wafers;

attaching the plurality of susceptors to the carrier;

transporting the carrier into the vacuum processing station to process the plurality of wafers simultaneously.

11. The method of claim 10, wherein affixing the plurality of masks comprises attaching plurality of inner masks to the carrier and attaching plurality of outer mark over the inner masks.

12. The method of claim 10, wherein attaching the susceptor to the carrier comprises applying magnetic force between the susceptor and the masks.

13. A method for processing wafers in a vacuum processing chamber, comprising:

attaching a plurality of masks onto a carrier;

transporting a plurality of susceptors into a loading position and loading a plurality of wafers, one wafer onto each of the susceptors;

moving the susceptors to an alignment station and aligning the wafers on the susceptors;

transporting the carrier into a loading station and loading a plurality of susceptors onto the carrier;

transporting the carrier with the susceptors into the vacuum processing chamber to process the wafers simultaneously.

14. The method of claim 13, wherein loading the wafers comprises placing the wafers onto a raised frame provided on each of the susceptors.

15. The method of claim 13, further comprising transporting the carrier out of the vacuum processing chamber and loading the susceptor onto an unloading stage.

* * * * *